US010373684B2

(12) United States Patent
Hayashi

(10) Patent No.: US 10,373,684 B2
(45) Date of Patent: Aug. 6, 2019

(54) SEMICONDUCTOR DEVICE

(71) Applicant: RENESAS ELECTRONICS CORPORATION, Tokyo (JP)

(72) Inventor: Daigo Hayashi, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/968,331

(22) Filed: May 1, 2018

(65) Prior Publication Data

US 2018/0374538 A1 Dec. 27, 2018

(30) Foreign Application Priority Data

Jun. 22, 2017 (JP) ................................. 2017-122246

(51) Int. Cl.
| | |
|---|---|
| *G11C 15/00* | (2006.01) |
| *G11C 15/04* | (2006.01) |
| *G06F 3/06* | (2006.01) |
| *G11C 5/14* | (2006.01) |
| *G11C 11/419* | (2006.01) |

(52) U.S. Cl.
CPC ............ *G11C 15/04* (2013.01); *G06F 3/0638* (2013.01); *G11C 5/14* (2013.01); *G11C 11/419* (2013.01)

(58) Field of Classification Search
CPC ......... G11C 15/04; G11C 5/14; G11C 11/419; G06F 3/0638
See application file for complete search history.

(56) References Cited

U.S. PATENT DOCUMENTS

| | | | | | |
|---|---|---|---|---|---|
| 6,731,526 | B2* | 5/2004 | Inoue | ..................... | G11C 15/04 365/168 |
| 8,984,217 | B2* | 3/2015 | Shen | ..................... | G11C 15/04 365/49.1 |
| 9,502,112 | B2* | 11/2016 | Nii | ......................... | G11C 15/04 |
| 10,121,541 | B2* | 11/2018 | Igaue | ..................... | G11C 15/04 |
| 10,191,839 | B2* | 1/2019 | Miki | .................. | G06F 12/0215 |
| 2007/0247885 | A1* | 10/2007 | Watanabe | ............. | G11C 15/04 365/49.17 |

(Continued)

FOREIGN PATENT DOCUMENTS

JP 62-293596 A 12/1987

*Primary Examiner* — Toan K Le
(74) *Attorney, Agent, or Firm* — McDermott Will & Emery LLP

(57) ABSTRACT

A semiconductor device includes an N number of sub-blocks each of including a memory cell array, a setting register specifying number of entry data for pre-searching, of first to N-th entry data divided and correspond respectively to the sub-blocks, and a search data changing unit changing a data arrangement order for search data input based on a value of the register. A sub-block for pre-searching searches for entry data matching with data for pre-searching in accordance with the arrangement order changed by the changing unit, in response to an instruction, and outputs a search result representing matching or non-matching. A sub-block for post-searching searches for entry data matching with data for post-searching other than the data for pre-searching, of entry data stored in association with each row of the array, based on a search result of the sub-block for pre-searching, and outputs a search result representing matching or non-matching.

9 Claims, 12 Drawing Sheets

(56) References Cited

U.S. PATENT DOCUMENTS

| | | | | |
|---|---|---|---|---|
| 2013/0283135 A1* | 10/2013 | Kiyoshi | ............... | G11C 15/04 714/800 |
| 2013/0297649 A1* | 11/2013 | Doji | ............... | G11C 15/00 707/769 |
| 2018/0025755 A1* | 1/2018 | Miki | ............... | G06F 3/0683 711/100 |

* cited by examiner

| SRAM CELL (X CELL) | SRAM CELL (Y CELL) | TCAM CELL DATA |
|---|---|---|
| "1" | "0" | "0" |
| "0" | "1" | "1" |
| "0" | "0" | "*" (don't care) |
| "1" | "1" | NO USE |

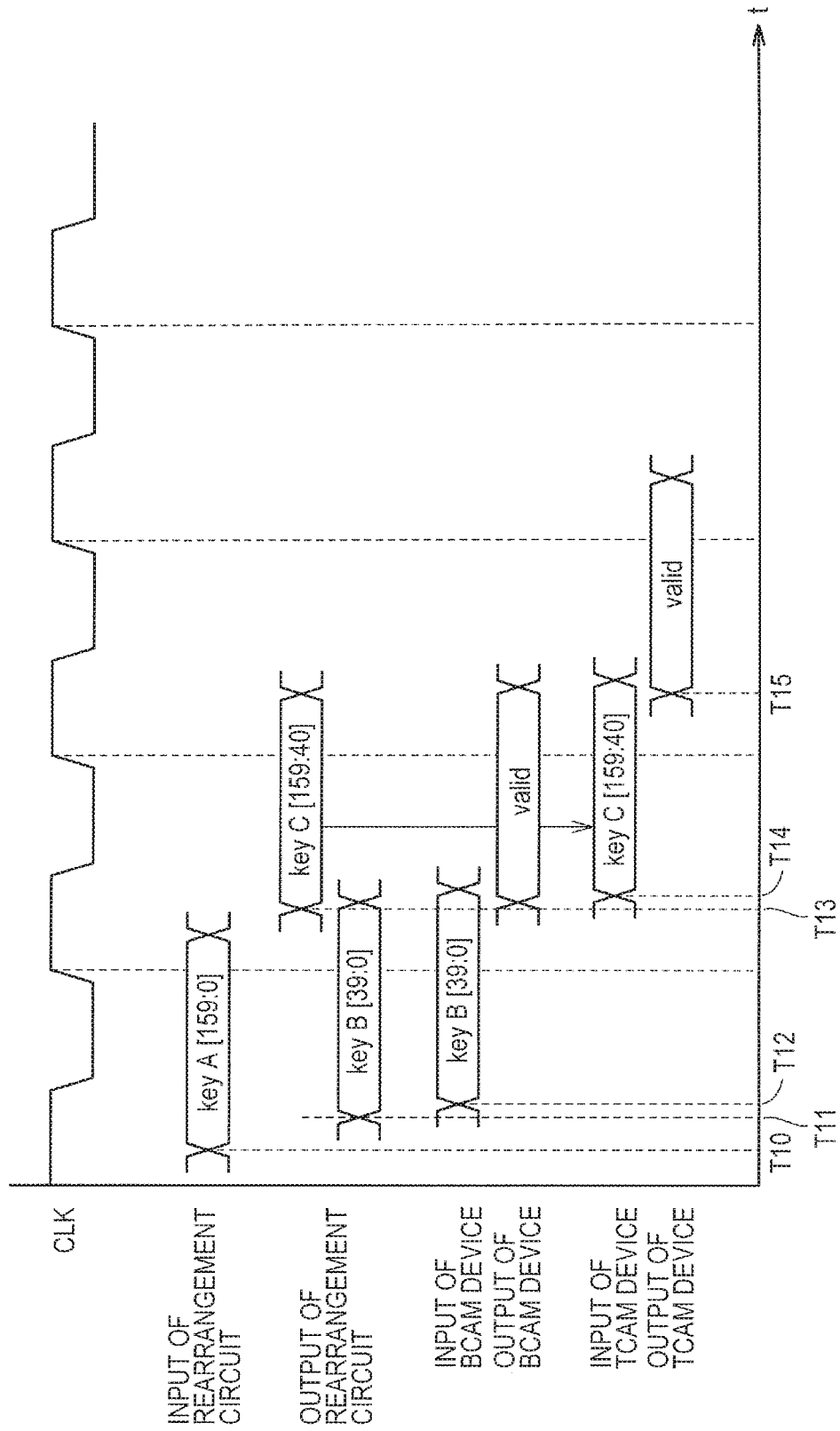

SEMICONDUCTOR DEVICE

CROSS-REFERENCE TO RELATED APPLICATIONS

The disclosure of Japanese Patent Application No. 2017-122246 filed on Jun. 22, 2017 including the specification, drawings and abstract is incorporated herein by reference in its entirety.

BACKGROUND

The present disclosure relates to a semiconductor device, and relates, for example, to an associative memory.

The storage device called an associative memory or a CAM (Content Addressable Memory) searches for a matching search word from stored data words, and, when a matching data word has been found, outputs its address.

The CAM includes BCAMs (Binary CAM) and TCAMs (Ternary CAM). Each memory cell of the BCAM stores information "0" or "1". In the TACM, each memory cell can store information not only "0" and "1", but also "Don't Care" (in this example, a symbol "*" is used). The symbol "*" represents that any of "0" and "1" is possible.

The TCAM device is widely used for address search and access control of a router for network, such as the Internet. To deal with the large memory capacity, the TCAM device generally has a configuration with a plurality of arrays and for executing search operations simultaneously for the arrays.

The TCAM device can compare input search data (input packet) and TCAM cell data at once. Thus, it can perform the entire searches at a higher speed than the RAM (Random Access Memory). However, a problem is that the consumption power is increased due to generation of a search current at the time of the search.

For this point, when a non-matching result (MISS) is generated based on searching (pre-searching) of the initial-stage segment by a time division search, it is possible to attain low power consumption for the search by not executing searching (post-searching) of the post-stage segment (Japanese Unexamined Patent Application Publication No. Sho 62-293596).

SUMMARY

However, from a viewpoint of the power consumption, it is preferred that the pre-search results in the non-matching in the time division search. For example, when the time division search is executed for fields included in a table, such as an ACL (Access Control List), power saving effects by the time division search are changed in accordance with the way of writing to the TCAM device even in the same table, because it is easy to obtain the "MISS" in some fields, while it is difficult to obtain the "MISS" in other fields.

The present invention seeks to solve the above problem. It is accordingly an object thereof to provide a semiconductor device which can realize low power consumption.

Any other objects and new features will be apparent from the descriptions of this specification and the accompanying drawings.

According to an embodiment, there is provided a semiconductor device comprising: an N number of sub-blocks each of which includes a memory cell array; a setting register which specifies number of entry data for pre-searching, of first to N-th entry data which are divided and correspond respectively to the N number of sub-blocks; and a search data changing unit which changes a data arrangement order for search data input based on a value of the setting register. A sub-block for pre-searching, of the N number of sub-blocks, searches for entry data which matches with data for pre-searching in accordance with the data arrangement order which has been changed by the search data changing unit, of entry data stored in each row of the memory cell array, in response to a search instruction, and outputs a search result representing matching or non-matching in association with each row. A sub-block for post-searching, of the N number of sub-blocks, searches for entry data which matches with data for post-searching other than the data for pre-searching of search data, of entry data stored in association with each row of the memory cell array, based on a search result of the sub-block for pre-searching, and outputs a search result representing matching or non-matching in association with each row.

According to an embodiment, the semiconductor device of the present disclosure can realize low consumption power.

BRIEF DESCRIPTION OF THE DRAWINGS

FIG. 15 is a diagram for explaining a search timing of the search block 10A.

DETAILED DESCRIPTION

Figure 1:
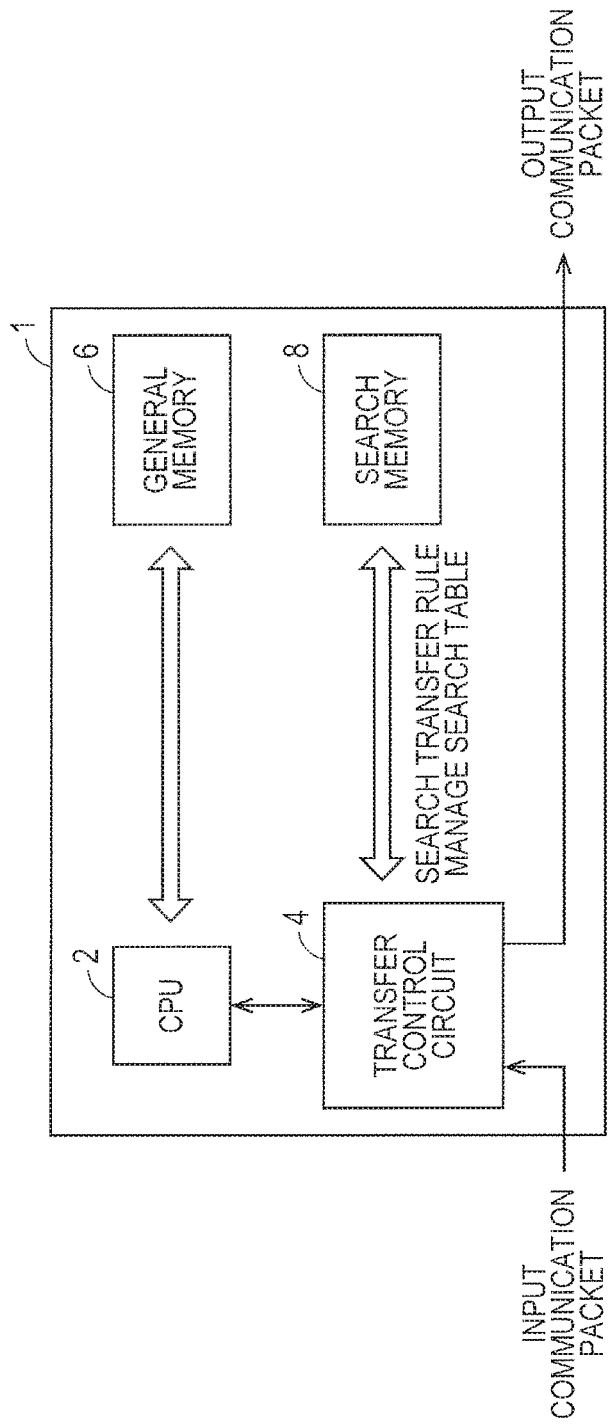
FIG. 1 is a diagram for explaining a configuration of a communication unit 1 based on a first embodiment.

Descriptions will hereinafter be made to preferred embodiments in reference to the accompanying drawings. The same or corresponding parts in the illustrations are identified by the same reference numerals, and thus will not be described over and over.

First Embodiment

<Entire Configuration of Communication Unit 1>

FIG. 1 is a diagram for explaining a configuration of a communication unit 1 based on a first embodiment.

As illustrated in FIG. 1, the communication unit 1 is a communication device, such as a switch or a router.

The communication unit 1 includes a CPU (Central Processing Unit) 2, a transfer control circuit 4, a general memory 6, and a search memory 8.

The CPU 2 controls the entire unit.

The CPU 2 realizes various functions in cooperation with a program stored in the general memory 6. For example, the general memory 6 can be configured with a DRAM (Dynamic Random Access Memory), to build an Operating System (OS) in cooperation with the CPU 2. The CPU 2 exchanges information with an adjacent communication unit, and maintains and manages information necessary for a transfer process.

The transfer control circuit 4 executes a transfer process for communication packets. The transfer control circuit 4 includes a dedicated hardware, such as an ASIC (Application Specific Integrated Circuit) specialized for a transfer process or an NPU (Network Processing Unit). The transfer control circuit 4 accesses the search memory 8, and acquires information necessary for the transfer process.

Descriptions will be made to a case in which the TCAM device is used as the search memory 8, in this embodiment.

<Configuration of Search Memory 8>

Figure 2:
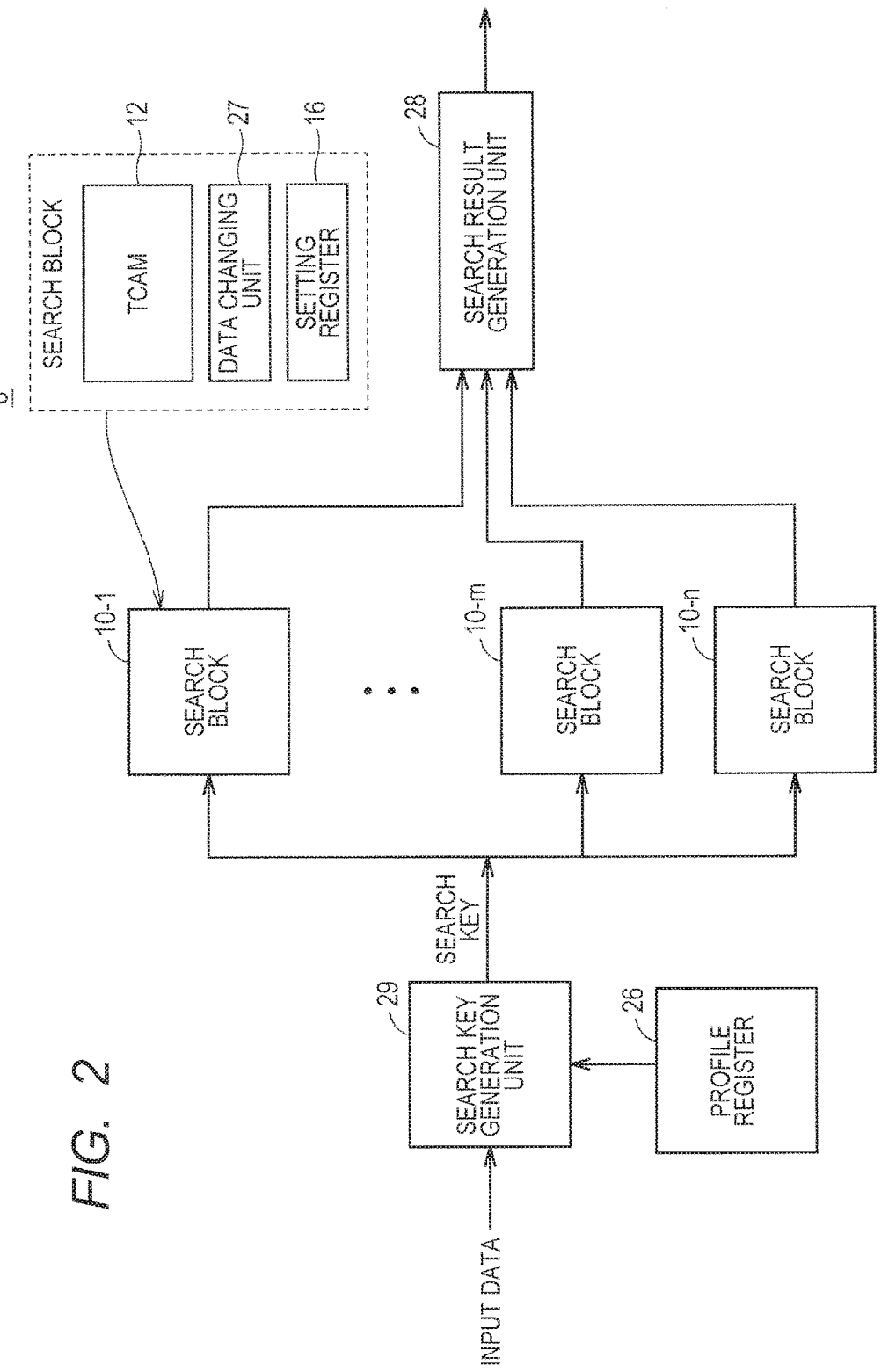
FIG. 2 is a diagram for explaining a configuration of a search memory 8 based on the first embodiment.

FIG. 2 is a diagram for explaining a configuration of the search memory 8, based on the first embodiment.

As illustrated in FIG. 2, the search memory 8 includes a search key generation unit 29 which generates a search key from input data, a profile register 26, a plurality of search blocks 10, and a search result generation unit 28.

The search memory 8 is entirely managed in the unit of search blocks 10 having a certain grain size. In this embodiment, descriptions will be made to a configuration in which a plurality of search blocks 10-1 to 10-$n$ are provided.

As will specifically be described later, the configuration of each search block 10 includes a TCAM device 12, a setting register 16 for specifying number of entry data for pre-search, and a data changing unit 27 changing the data arrangement order based on the value of the setting register 16.

The profile register 26 has various settings necessary for the search.

Based on information of the profile register 26, the search key generation unit 29 generates a search key from input data.

The search blocks 10-1 to 10-$n$ are parallelly provided, and have a parallel search function.

The search result generation unit 28 gives priority to the search results from the search blocks 10, and generates the final search results.

When a search command is issued, the search key generation unit 29 generates a search key based on received data and various information items, such as the profile register 26.

The search key generation unit 29 distributes the keys to the search blocks 10. In each of the search blocks 10, the data changing unit 27 changes and outputs the data arrangement order of the search keys, based on a register value set in advance in the setting register 16. The search keys which have been changed in this manner have unique values for each search block 10.

<Configuration of TCAM Device 12>

Figure 3:
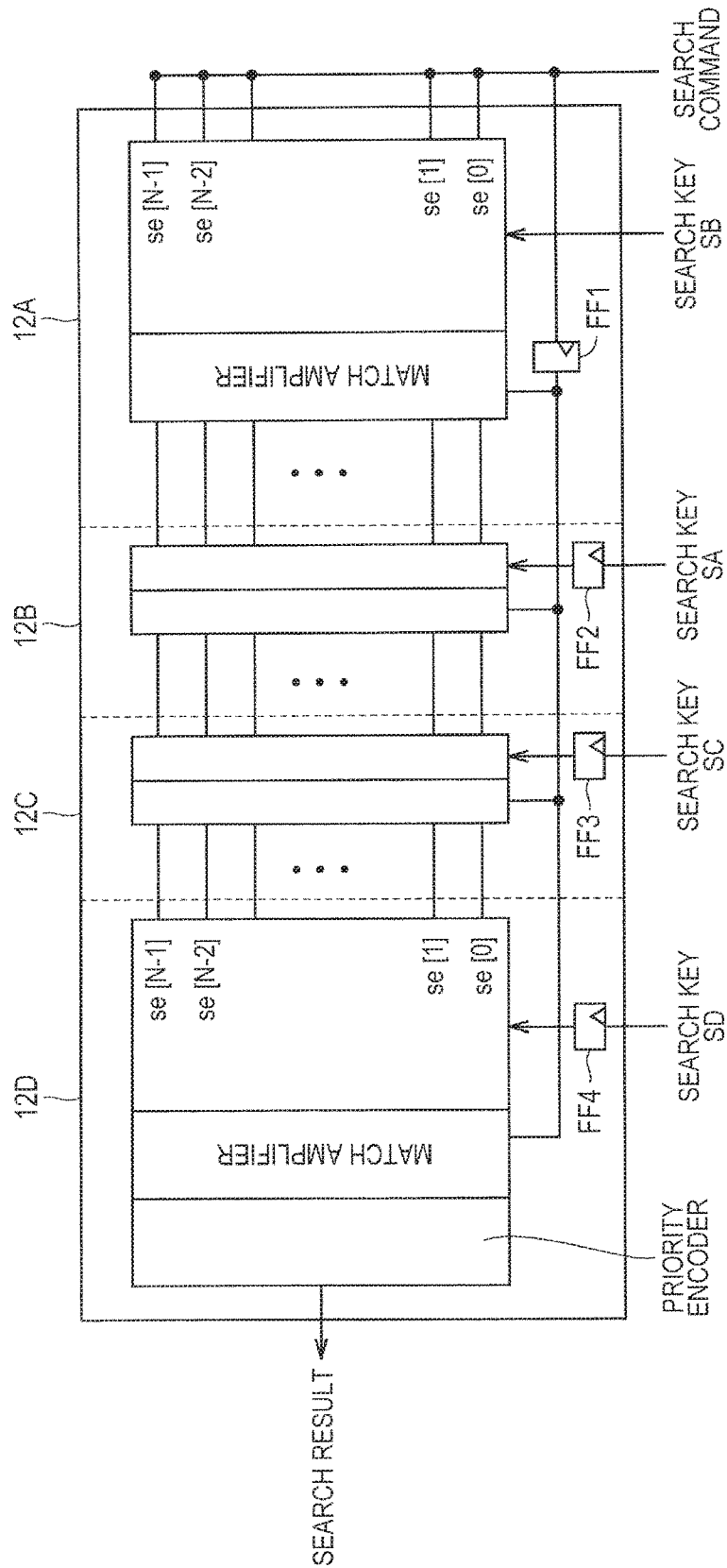
FIG. 3 is a diagram for explaining a configuration of a TCAM device 12 based on the first embodiment.

FIG. 3 is a diagram for explaining a configuration of the TCAM device 12 based on the first embodiment.

As illustrated in FIG. 3, the TCAM device 12 has a time division search function.

The TCAM device 12 is divided into a plurality of segments (sub-blocks). In this embodiment, it is divided into four segments (sub-blocks).

As an example, descriptions are made to a case in which it is divided into segments 12A to 12D.

The segments 12A to 12D are coupled from the initial stage to the post stage.

Each of the segments 12A to 12D substantially has the same configuration, and has a memory cell array and a match amplifier. The segment 12D of the final stage has a memory cell array, a match amplifier, and a priority encoder.

The match amplifier exists at least in each segment, and amplifies and outputs a judgment result regarding matching or non-matching indicated by match lines.

The priority encoder converts an input from the match amplifier into an address, and generates the final output.

The memory cell array has a plurality of "se" (Search Enable) terminals. The pre-charging for the match line is performed for only in an asserted region based on the "se" terminals, thereby enabling to limit the search range.

In this embodiment, a flip flop FF1 for keeping a signal for activating the match amplifier is provided, as an example. Specifically, when a search command is input to the flip flop FF1, the signal for activating the match amplifier is kept, and output to the match amplifier of each segment.

The segments 12B to 12D have a configuration, in which flip flops FF2 to FF4 are provided, and the search key can be kept until completion of a search process in the initial stage segment. In this embodiment, a search key SB is input to the segment 12A, a search key SA is input to the segment 12B, and search keys SC and SD are input to the segments 12C and 12D.

A match amplifier output is coupled to the "se" terminal of the post stage segment. As a result, only the entries matching in the initial stage segment can be assumed as a target to be searched.

Specifically, only the segment 12A of the initial stage is activated, to execute a first search. A second search is executed only for the matching regions as a result of the first search in the segment 12B. Similarly, a third search and a fourth search are executed. It is possible to suppress consumption power of the segment of the post stage by an amount corresponding to the non-matching region as a result of the search of the initial stage segment.

<Configuration of Segment (Sub-Block)>

[Configuration of TCAM Cell]

Figures 4, 5:
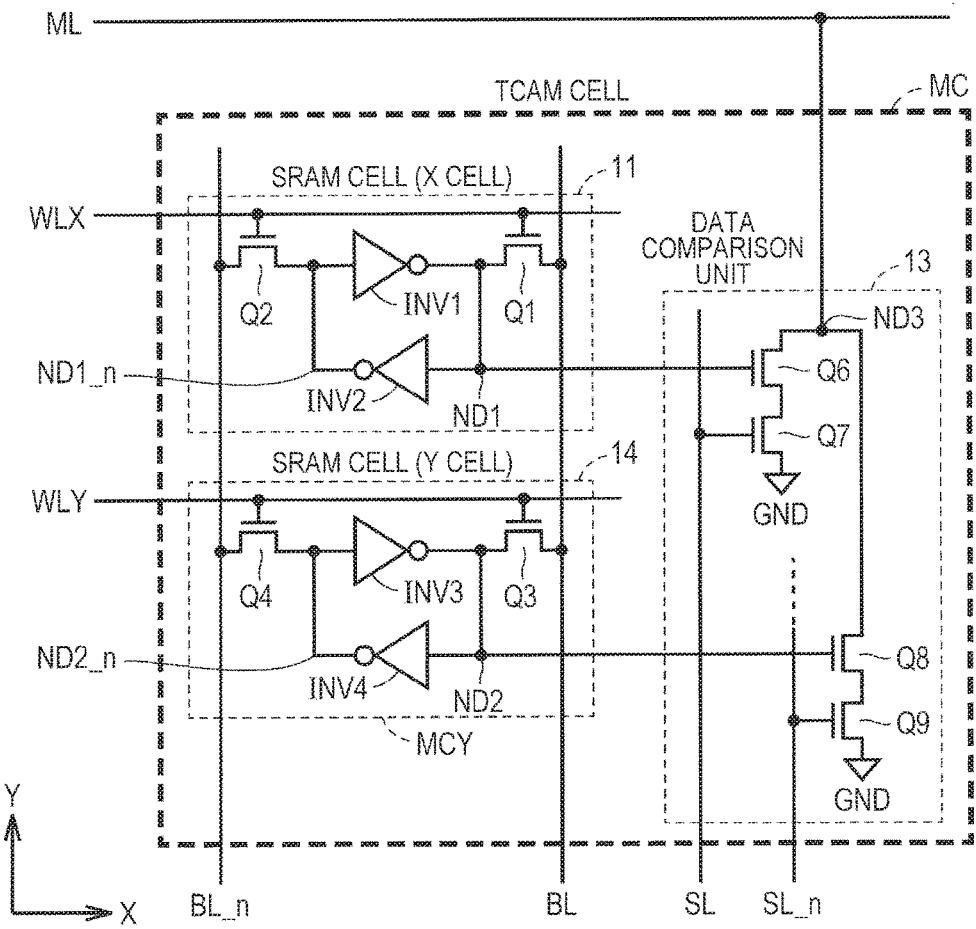
FIG. 4 is a circuit diagram illustrating an example of a configuration of a TCAM cell.
FIG. 5 is a diagram illustrating a correspondence relation of storage contents of the X cell and the Y cell of FIG. 4 and TCAM data.

FIG. 4 is a circuit diagram illustrating an example of a configuration of the TCAM cell.

By reference to FIG. 4, the TCAM cell (referred to also a memory cell MC) includes two SRAM cells (Static Random Access Memory Cell) 11 and 12 and a data comparison unit 13. The SRAM cell 11 is referred to also as an X cell, and an SRAM cell 14 is referred to also as a Y cell. The X cell 11 stores complementary 1-bit data (that is, when one is "1", the other one is "0") in a pair of internal storage nodes ND1 and ND1_$n$. The Y cell 14 stores complementary 1-bit data in a pair of internal storage nodes ND2 and ND2_$n$. The TCAM cell is referred to also as an associative memory.

The TCAM cell is coupled to a pair of bit lines BL and BL_$n$, a pair of search lines SL and SL_$n$, a match line ML, and word lines WLX and WLY. The pair of bit lines BL and BL_$n$ extend in a column direction (Y direction) of the TCAM cell array 20 of FIG. 6, and are commonly shared by a plurality of TCAM cells arranged in the column direction. The pair of search lines SL and SL_n extend in the column direction (Y direction) of the TCAM cell array 20, and are commonly shared by the plurality of TCAM cells arranged in the column direction.

The match line ML extends in a row direction (X direction) of the TCAM cell array 20, and is commonly shared by a plurality of TCAM cells arranged in a row direction. The word lines WLX and WLY extend in the row direction (X direction) of the TCAM cell array 20, and are commonly shared by the plurality of TCAM cells arranged in the row direction.

The X cell 11 includes inverters INV1 and INV2 and N-channel MOS (Metal Oxide Semiconductor) transistors Q1 and Q2. The inverter INV1 is coupled between the storage node ND1 and the storage node ND1_n, to attain a forward direction from the storage node ND1_n to the storage node ND1. The inverter INV2 is coupled parallelly to and in a backward direction to the inverter INV1. The MOS transistor Q1 is coupled between the storage node ND1 and the bit line BL. The MOS transistor Q2 is coupled between the storage node ND1_n and the bit line BL_n. The gates of the MOS transistors Q1 and Q2 are coupled to the word line WLX.

The Y cell 14 includes inverter INV3 and INV4 and MOS (Metal Oxide Semiconductor) transistors Q3 and Q4. The inverter INV3 is coupled between the storage node ND2 and the storage node ND2_n, to attain a forward direction from the storage node ND2_n to the storage node ND2. The inverter INV4 is coupled parallelly to and in a backward direction to the inerter INV3. The MOS transistor Q3 is coupled between the storage node ND2 and the bit line BL. The MOS transistor Q4 is coupled between the storage node ND2_n and the bit line BL_n. The MOS transistor Q4 is coupled between the storage node ND2_n and the bit line BL_n. The gates of the MOS transistors Q3 and Q4 are coupled to the word line WLY.

The data comparison unit 13 includes N-channel MOS transistors Q6 to Q9. The MOS transistors Q6 and Q7 are coupled in series between a node ND3 as a coupling point to the match line ML and a ground node GND. The MOS transistors Q8 and Q9 are coupled in series between the node ND3 and the ground node GND, and are coupled parallelly entirely to the MOS transistors Q6 and Q7 which are coupled in series. The gates of the MOS transistors Q6 and Q8 are coupled respectively to the storage nodes ND1 and ND2. The gates of the MOS transistors Q7 and Q9 are coupled respectively to the search lines SL and SL_n.

FIG. 5 is a diagram illustrating a correspondence relation of storage contents of the X cell and the Y cell of FIG. 4 and the TCAM data.

By reference to FIG. 4 and FIG. 5, the TCAM cell can store any of three values, "0", "1", "*" (don't care), using the SRAM cells for 2 bits. Specifically, when the storage node ND1 of the X cell 11 stores "1", and when the storage node ND2 of the Y cell 14 stores "0", the TCAM cell stores "0". When the storage node ND1 of the X cell 11 stores "0", and when the storage node ND2 of the Y cell 14 stores "1", the TCAM cell stores "1". When the storage node ND1 of the X cell 11 stores "0", and when the storage node ND2 of the Y cell 14 stores "0", the TCAM cell stores "*" (Don't care). When the storage node ND1 of the X cell 11 stores "1", and when the storage node ND2 of the Y cell 14 stores "1", it is not used.

In the configuration of the above-described TCAM cell, when the search data is "1" (that is, the search line SL is "1", and the search line SL_n is "0"), and when the TCAM data is "0" (the storage node ND1 is "1", and the storage node ND2 is "0"), the MOS transistors Q6 and Q7 are ON. Then, the potential of the pre-charged match line ML is pulled down to the ground potential. When the search data is "0" (that is, the search line SL is "0", and the search line SL_n is "1"), and when the TCAM data is "1" (the storage node ND1 is "0", and the storage node ND2 is "1"), the MOS transistors Q8 and Q9 are ON. Then, the potential of the pre-charged match line ML is pulled down to the ground potential. That is, when the search data does not match with the TCAM data, the potential of the match line ML is pulled down to the ground potential.

On the contrary, when the input search data is "1", and when the TCAM data is "1" or "*", alternatively, when the search data is "0", and when the TCAM data is "0" or "*" (that is, when both data match with each other), the potential (power supply potential VDD level) of the pre-charged match line ML is maintained.

As described above, in the TCAM, unless the data of the entire TCAM cells coupled to the match line corresponding to one entry (row) matches with input search data, the charges accumulated in the match line ML are extracted. Thus, though the high-speed search is performed in the TCAM, a problem is that the consumption current is large.

Figure 6:
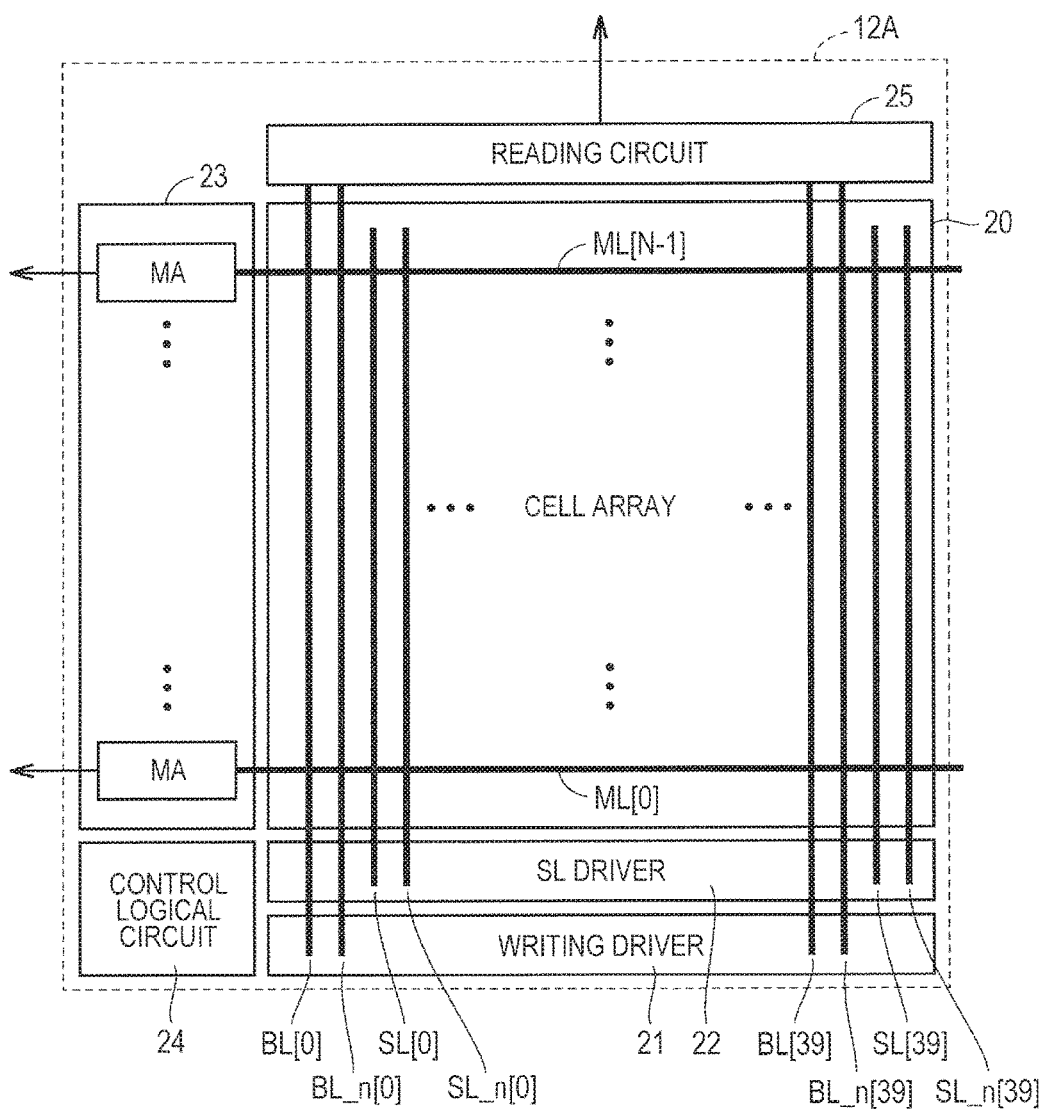
FIG. 6 is a diagram for explaining a configuration of a segment (sub block) 12A based on the embodiment.

FIG. 6 is a diagram for explaining a configuration of the segment (sub-block) 12A based on the embodiment.

As illustrated in FIG. 6, the segment 12A includes a TCAM cell array 20 (referred to also as a cell array), a writing driver 21, a search line driver 22, a match amplifier unit 23, a control logical circuit 24, and a reading circuit 25.

The segment 12A includes a word line driver (not illustrated) for driving the word lines WLX and WLY and an input/output circuit (not illustrated) receiving an input of a control signal or an address signal.

The TCAM cell array 20 includes TCAM cells arranged in matrix (m-rows, k-columns). In this embodiment, in the cell array 20, the "m" number of rows (number of entries) is N, and the "k" number of columns (number of bits) is 40.

In a manner corresponding to each column of the cell array 20, there are provided a "k" (k=40) number of pairs of bit lines (from BL[0] and BL_n[0] up to BL[k-1] and BL_n[k-1]) and a "k" number of pairs of search lines (from SL[0] and SL_n[0] up to SL[k-1] and SL_n[k-1]).

In a manner corresponding to each row of the cell array 20, there are provided an "m" number (m=N) of match lines (from ML[0] up to ML[N]), a non-illustrative "m" number of word lines for X cell (from WLX[0] up to WLX[m-1]), and a non-illustrative "m" number of word lines for Y cell (from XLY[0] up to WLY[m-1]).

At the time of writing, the writing driver 21 supplies writing data to each of TCAM cells through the pair of bit lines BL and BL_n. At the time of searching, the search line driver 22 supplies search data to each of the TCAM cells through the pair of search lines SL and SL_n.

The control logical circuit 24 controls the entire operation of the segment 12A. For example, at the time of searching, the control logical circuit 24 receives a search command, and outputs a control signal to the search line driver 22 and the match amplifier unit 23, thereby controlling the operation of the search line driver 22, the match amplifier unit 23, and the pre-charge circuit. The control logical circuit 24 receives a read command at the time of reading, and outputs a control signal for controlling the reading circuit 25. As a result, it is possible to read and output entry data stored in the cell array 20.

The match amplifier unit 23 includes a plurality of match amplifiers MA corresponding respectively to the rows of the cell array. At the time of searching, the match amplifiers MA detect whether corresponding TCAM cell data and a corresponding part of input search data match with each other, based on the potential of a corresponding match line ML. In this embodiment, the match amplifiers MA include a pre-charge circuit for precharging the corresponding match line ML, at the time of searching.

Figure 7:
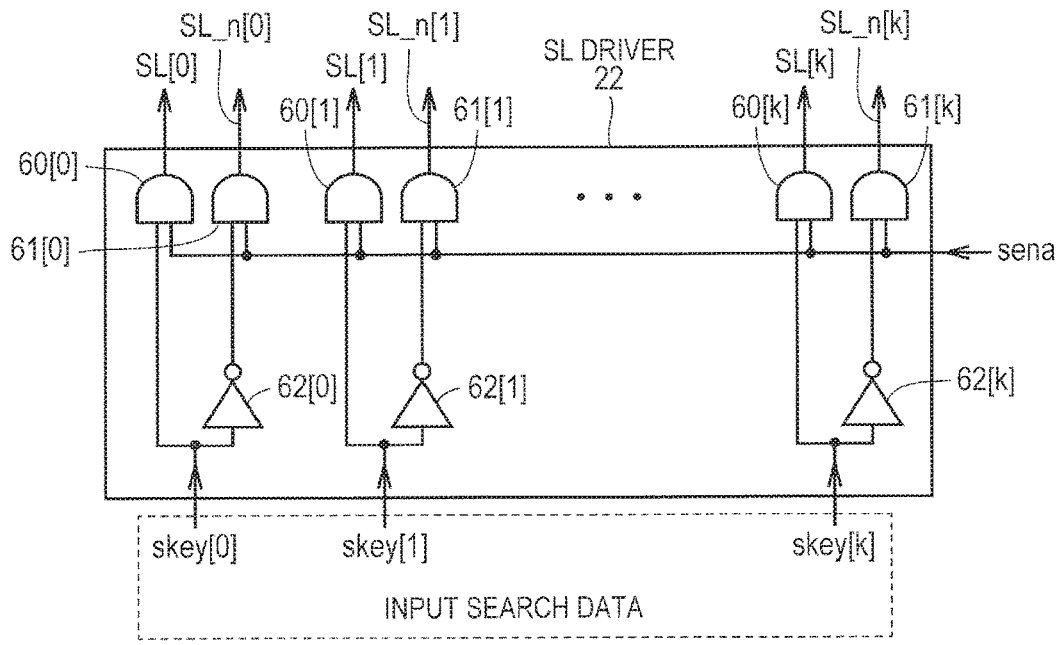
FIG. 7 is a circuit diagram illustrating an example of a configuration of a search line driver 22.

FIG. 7 is a circuit diagram illustrating an example of a configuration of the search line driver 22.

As illustrated in FIG. 7, the search line driver 22 outputs input search data "skey [i]" (i=0, 1, . . . [k]) to the search line SL [i], when a search line enable signal "sena" is activated to an [H] level. It outputs a signal obtained by inverting the logical level of the input search data "skev[i]" to the complementary search line SL_n[i].

In this embodiment, as an example, descriptions will be made to a case in which the search key SB is configured as the input search data "skey[i]" (i=0, 1, . . . , k).

Specifically, the search line driver 22 includes AND gates 60[0] to 60[k] respectively corresponding to the search lines SL[0] to SL[k], AND gates 61[0] to 61[k] respectively corresponding to the search lines SL_n[0] to SL_n[k], and inverters 62[0] to 62[k].

The search line enable signal "sena" is commonly input to the AND gates 60[0] to 60[k] and the AND gates 61[0] to 61[k]. Further, to the AND gate 60[i] (i=0, 1, . . . , k), corresponding input search data "skey"[i] is input.

An output signal of the AND gate 60[i] (i=0, 1, . . . , k) is transmitted to the search line SL[i]. To the AND gate 61[i] (i=0, 1, . . . , k), a signal which is obtained by inverting corresponding input search data "skey[i]" is input.

According to the above-described configuration, when, for example, the search line enable signal "sena" is activated to an [H] level, and when the input search data "skey[i]" is at an [H] level ("1"), the voltage of the search line SL[i] is at the [H] level, and the voltage of the search line SL_n[i] is at an [L] level. When the search line enable signal "sena" is activated to the [H] level, and when the input search data "skey[i]" is at the [L] level ("0"), the voltage of the search line SL[i] is at the [L] level, and the voltage of the search line SL_n[i] is at the [H] level.

Figure 8:
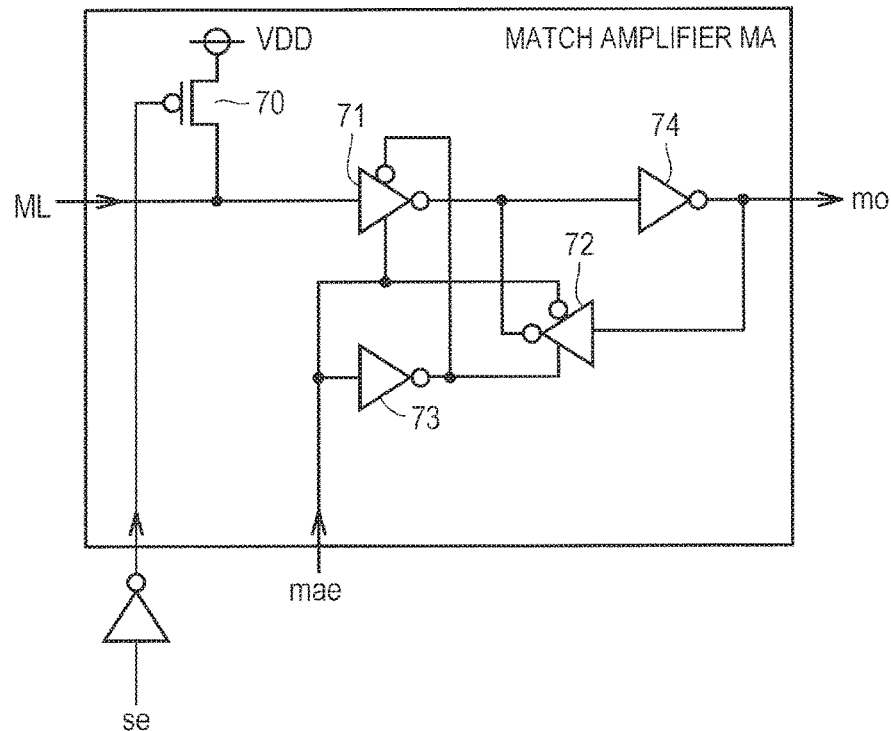
FIG. 8 is a circuit diagram illustrating an example of a configuration of a match amplifier.

FIG. 8 is a circuit diagram illustrating an example of a configuration of a match amplifier.

By reference to FIG. 8, the match amplifier MA includes a P-channel MOS transistor 70 as a pre-charge circuit and inverters 71 to 74.

As illustrated, the MOS transistor 70 as a pre-charge circuit is included in the match amplifier MA. However, the MOS transistor 70 may be provided outside the match amplifier MA. The control logical circuit 24 outputs a match amplifier enable signal "mae".

As described above, in this embodiment, the "se" terminal is provided for a pre-charge signal for precharging the match line. In this case, an input from the "se" terminal is inverted by the inverter, and the inverted signal is input to the MOS transistor 70 as a pre-charge signal.

Therefore, as explained in FIG. 3, in the segment of the initial stage, when the [H] level ("1") is input to the "se" terminal as a search command, the entire match lines are pre-charged.

In the segment of the second stage or after, when the output of the match amplifier MA of the initial stage is at the [L] level, because the output from the match amplifier MA in the segment of the initial stage is coupled to the "se" terminal, the match line on the same row in the segment of the next stage is not pre-charged. When the output from the match amplifier MA of the initial stage is at the [H] level, the match line on the same row in the segment of the next stage is pre-charged. Thus, the match amplifier output of the segment of the initial stage is coupled to the "se" terminal of the post-stage segment. As a result, only the entries matching in the initial stage can be assumed as targets to be searched. It is possible to suppress consumption power of the post-stage segment by an amount corresponding to the non-matching region as a result of the search of the initial-stage segment.

Descriptions will hereinafter be made to coupling of the above-described constituent elements. The MOS transistor 70 is coupled between a corresponding match line ML and a power supply node for supplying a power supply potential VDD. To the gate of the MOS transistor 70, a match line pre-charge signal as a inverted signal of the "se" terminal is input. The match line ML is further coupled to the input node of the inverter 71. The output node of the inverter 71 is coupled to the input node of the inverter 74. The output node of the inverter 74 is coupled to the input node of the inverter 72 through the inverter 72.

The match amplifier enable signal "mae" and a signal which is obtained by inverting the logical level thereof by the inverter 73 are coupled to the driving power supply node of the inverters 71 and 72. When the match amplifier enable signal "mae" is in a non-activated state ([L]) level, the inverter 71 is in a non-operation state, and the inverter 72 is in an operation state. When the match amplifier enable signal "mae" is activated ([H] level), the inverter 71 is in an operation state, and the inverter 72 is in a non-operation state.

Descriptions will be made to a circuit operation of the match amplifier MA. If the match line pre-charge signal is activated ([L] level), the MOS transistor 70 is conductive. As a result, the match line ML is charged (pre-charged) up to the power supply potential VDD.

After the match line pre-charged signal is non-activated, the search line enable signal "sena" is activated ([H] level), thus inputting search data to the pair of search lines SL and SL_n. As a result, the potential of the match line ML depends on the search result (a comparison result of a corresponding part of the input search data and the TCAM cell data). That is, in the case of "matching" (hit), the potential of the match line ML is maintained as the power supply potential VDD ([H] level). On the other hand, in the case of "non-matching" (MISS), the charges of the match line ML are discharged to the ground node. As a result, the potential of the match line is changed to the ground potential ([L] level).

The match amplifier enable signal is activated now ([H] level). Then, the potential of the match line ML based on the search result is output through the inverter 71 and the inverter 74 as a match amplifier output signal "mo". If the match amplifier enable signal "mae" is non-activated ([L] level), the potential of the match line ML based on the search result is maintained by a latch circuit which is configured with the inverter 74 and the inverter 72.

<Search Method of Search Block 10>

Figure 9:
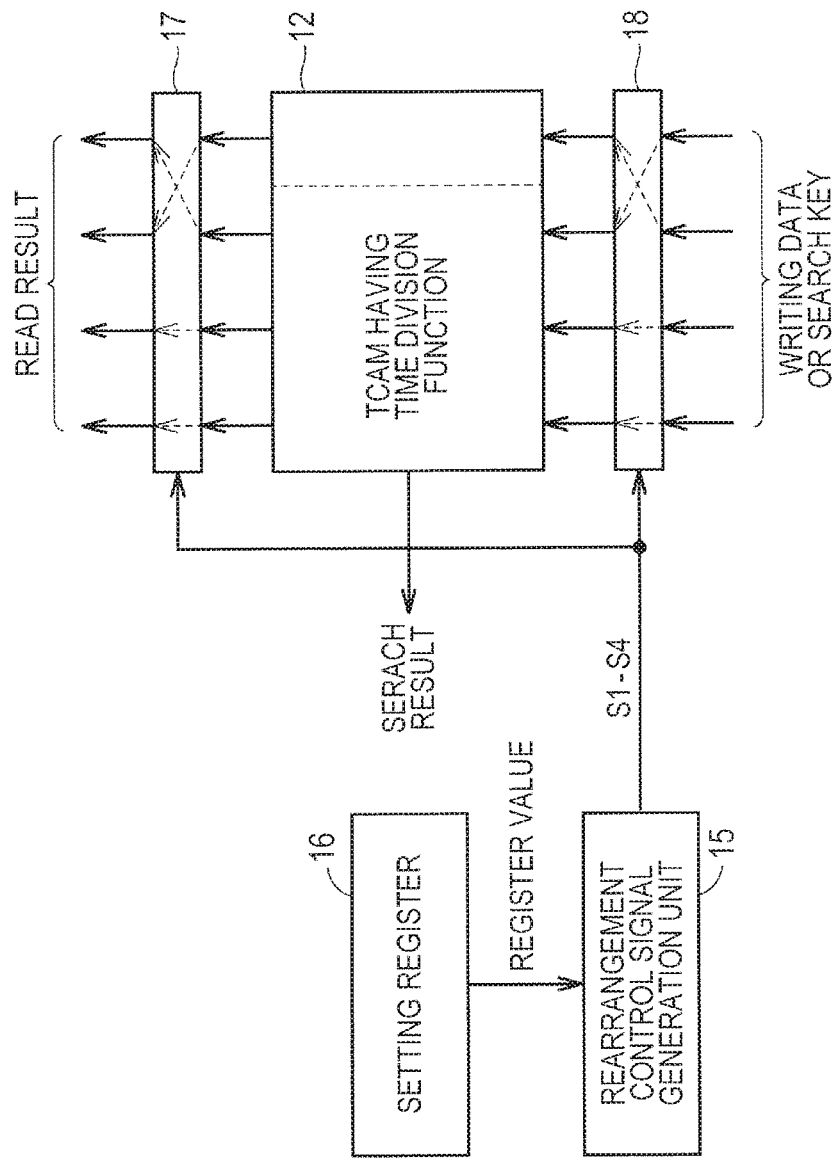
FIG. 9 is a diagram for explaining a search method of a search block 10 based on the first embodiment.

FIG. 9 is a diagram for explaining a search method of the search block 10 based on the first embodiment.

As illustrated in FIG. 9, the search block 10 includes the setting register 16, a rearrangement control signal generation unit 15, rearrangement circuits 17 and 18, and the TCAM device 12.

The rearrangement control signal generation unit 15 and the rearrangement circuits 17 and 18 are provided to form a data changing unit 27.

The TCAM device 12 has a time division search function.

The rearrangement circuits 17 and 18 are crossbar switches.

The rearrangement control signal generation unit 15 outputs a control signal for instructing rearrangement to the rearrangement circuits 17 and 18 based on a register value of the setting register 16.

In this embodiment, the crossbar switches are used as the rearrangement circuits 17 and 18. However, it is possible to use any circuit, as long as it can rearrange a region effective for the time division search into a particular position. For example, it is possible to use a configuration for switching upper bits and lower bits of data, or it is possible to use a rotation circuit.

In this embodiment, descriptions will be made to the configuration of the TCAM device as the search block 10, by way of example. However, it is not limited to this. Any other device is possible, as long as it has a data structure for which the time division search can be performed.

The search block 10 has a data bus for use at the time of writing and searching and control system pins, as input pins. The search block 10 has, as output pins, search result output pins and a read result output data bus.

The rearrangement circuits 17 and 18 perform rearrangement for the signals of the input and output data buses. Specifically, they change the data arrangement order.

The rearrangement circuits 17 and 18 change the data arrangement order in accordance with a control signal generated by the rearrangement control signal generation unit 15.

In this embodiment, descriptions will be made to a case in which the TCAM device 12 is divided into four segments (sub-blocks). Of the four segments (sub-blocks), the first segment (sub-block) is a target for the pre-search, and the second to fourth segments (sub-blocks) are targets for the post-search.

In this embodiment, the setting register 16 specifies the number of entry data for the pre-search, of the first to fourth entry data after divided in a manner corresponding respectively to the four segments (sub-blocks). The setting register 16 stores 2-bit data, as an example.

The rearrangement control signal generation unit 15 generates control signals S1 to S4 based on the data of the setting register 16.

For example, when the setting register 16 stores "00", the rearrangement control signal generation unit 15 outputs the control signal S1 to the rearrangement circuits 17 and 18.

When the control signal S1 is input, the rearrangement circuits 17 and 18 output it as is, without changing its data arrangement order.

When the setting register 16 stores "01", the rearrangement control signal generation unit 15 outputs the control signal S2 to the rearrangement circuits 17 and 18.

When the control signal S2 is input, the rearrangement circuits 17 and 18 change the data arrangement order, and output it. Because the TCAM device 12 is divided into the four segments (sub-blocks), write data or a search key is also divided into four fields to respectively correspond to the segments. The rearrangement circuit 17 changes the data arrangement order, for switching the second field and the first field of the write data or the search key, in accordance with the input of the control signal S2.

The rearrangement circuit 18 changes the data arrangement order for switching the second field and the first field of the read data, in accordance with the input of the control signal S2.

When the setting register 16 stores "10", the rearrangement control signal generation unit 15 outputs the control signal S3 to the rearrangement circuits 17 and 18.

When the control signal S3 is input, the rearrangement circuits 17 and 18 change the data arrangement order, and output it. The write data or the search key is divided into four fields. The rearrangement circuit 17 changes the data arrangement order for switching the third field and the first field of the write data or the search key, in accordance with the input of the control signal S3.

The rearrangement circuit 18 changes the data arrangement order for switching the third field and the first field of the read data, in accordance with the input of the control signal S3.

When the setting register 16 stores "11", the rearrangement control signal generation unit 15 outputs the control signal S4 to the rearrangement circuits 17 and 18.

When the control signal S4 is input, the rearrangement circuits 17 and 18 change the data arrangement order, and output it. The write data or the search key is divided into four fields. The rearrangement circuit 17 changes the data arrangement order for switching the fourth field and the first field of the write data or the search key, in accordance with the input of the control signal S4.

The rearrangement circuit 18 changes the data arrangement order for switching the fourth field and the first field of the read data, in accordance with the input of the control signal S4.

(Initialization (Setting) of Search Memory 8)

The communication unit 1 explained in FIG. 1 has rule sets necessary for performing a transfer process, for example, ACL or FIB (Forwarding Information Base).

In any of the cases, it may be set manually by the user, or may automatically be generated using a particular communication protocol.

Each of the rule sets is configured with a group of fields including information, such as an IP address or a port number, necessary for a packet transfer process.

Of the rule sets, there may exists a rule in which information is set entirely in the all fields, and there may also exists a rule in which information is partially set only in some field.

As an example, an IPv4 address is 32-bit data. There is a concept of a network part and a host part therein. An operation is performed in a manner that only the upper N bits of the network part are usually targets to be searched, while the lower (32-N) bits are not included in the targets.

To correspond to the part excluded from the targets to be searched, data of "Don't care" is written in the search memory 8.

When a field including a large number of bits of "Don't care" is assigned to the initial-stage segment (sub-block) of the time division search, the segment does not have a function for limiting the entries. Thus, it is difficult to reduce the consumption power in the time division search.

The port numbers may be collectively handled in a particular range, for example, a range between 1024 and 65335. For the rule set including this range information, there is applied a method for expressing one rule for a plurality of entries using a range development algorithm.

At this time, the same data is copied in the entire fields, excluding the port numbers.

Thus, there locally exist field regions in which limiting of entries is not effectively performed, when the rule set is stored in the search memory 8.

In this embodiment, in the time division search, a field region in which limiting of the entries is effectively performed is assigned to the initial-stage segment (sub-block).

At the time of performing initialization (setting) of the search memory 8, the CPU 2 executes an analysis process for the rule sets stored in the search memory 8.

Normally, the rule sets are kept in the form of a table. However, rule tables are expressed in a form that a human can easily manage it. Thus, it is necessary to convert the rule tables into a form suitable for the hardware for searching.

The converted table is assigned to each block of the search memory 8, and is used for setting the data width or mask of the setting register 16 and setting the profile register 26.

The CPU 2 performs data analysis for the sub-tables which are obtained by dividing the rule table in the unit of search blocks 10.

The CPU 2 specifies a field effective for the time division search in each search block 10 by the data analysis for the sub-tables.

In this embodiment, descriptions will be made to a case in which the TCAM device 12 included in the search block 10 has four sub-blocks.

As an example, when the entry data of the sub-table has a length of 160 bits, it is divided into four fields of 40 bits.

The CPU 2 specifies any field which is effective for the time division search, of the four fields respectively corresponding to the four sub-blocks stored in each search block 10.

At this point, it specifies, as the effective field, the field without the bit of "Don't Care" or with only very few thereof.

As an example, it specifies, as the effective field, the second field, of the first to fourth fields.

In this case, the CPU 2 sets "01" in the setting register 16 of the search block 10, based on the analysis result.

As a result, when "01" is stored in the setting register 16, the rearrangement control signal generation unit 15 outputs the control signal S2 to the rearrangement circuits 17 and 18.

The rearrangement circuits 17 and 18 change the data arrangement order, when the control signal S2 is input.

In this case, the rearrangement circuit 17 changes the data arrangement order for switching the second field and the first field of the entry data of the sub-table.

Then, the sub-tables corresponding to the changed data arrangement order are stored respectively in the four sub-blocks. That is, if the data arrangement order is not changed, data of the first field in the sub-table is stored in the first sub-block, and the second field in the sub-table is stored in the second sub-block. However, if the data arrangement order is changed, the second field in the sub-table is stored in the first sub-block, and the first field in the sub-table is stored in the second sub-block.

The above settings are performed for each search block 10.

Thus, in the search blocks 10-1 to 10-_n_ illustrated in FIG. 2, different values may be stored in the setting register 16 based on the analysis result of the stored sub-table.

In this manner, the initialization (setting) of the search memory 8 is completed, and an actual transfer process, that is, a data writing process starts.

(Search of Search Memory 8)

At the time of searching, the search key generation unit 29 generates a search key.

This search key is output to each search block 10.

Each search block 10 generates a control signal based on the value of the setting register 16.

As an example, when the value of the setting register 16 is "01", the rearrangement control signal generation unit 15 outputs the control signal S2 to the rearrangement circuits 17 and 18.

When the control signal S2 is input, the rearrangement circuits 17 and 18 change the data arrangement order, and output the search key.

In this case, rearrangement circuit 17 divides the input search key into four search keys SA to SD, and changes the data arrangement order of the second search key SB and the first search key SA.

The rearrangement circuit 17 outputs the search keys of the changed data arrangement order respectively to the segments 12A to 12D. That is, the second search key SB is output to the segment 12A, and the first search key SA is output to the segment 12B.

Then, a comparison process for the second field of the sub-table and the search key SB is executed as a first search, though it is originally executed as a second search. The second field of the sub-table is specified as an effective field without the bit of "Don't Care" or with only very few thereof, and is easily non-matched with it.

Thus, when the field is non-matched with it, the non-matching entry of the post-stage segment is not a target to be searched. This enables to suppress the consumption power of the segment of the post stage.

In this embodiment, the descriptions have been made to the case in which the second field of the sub-table is specified as the effective field. However, it is not limited to this case. The same applies to a case in which the third field and the fourth field are specified as effective fields.

Figure 10:
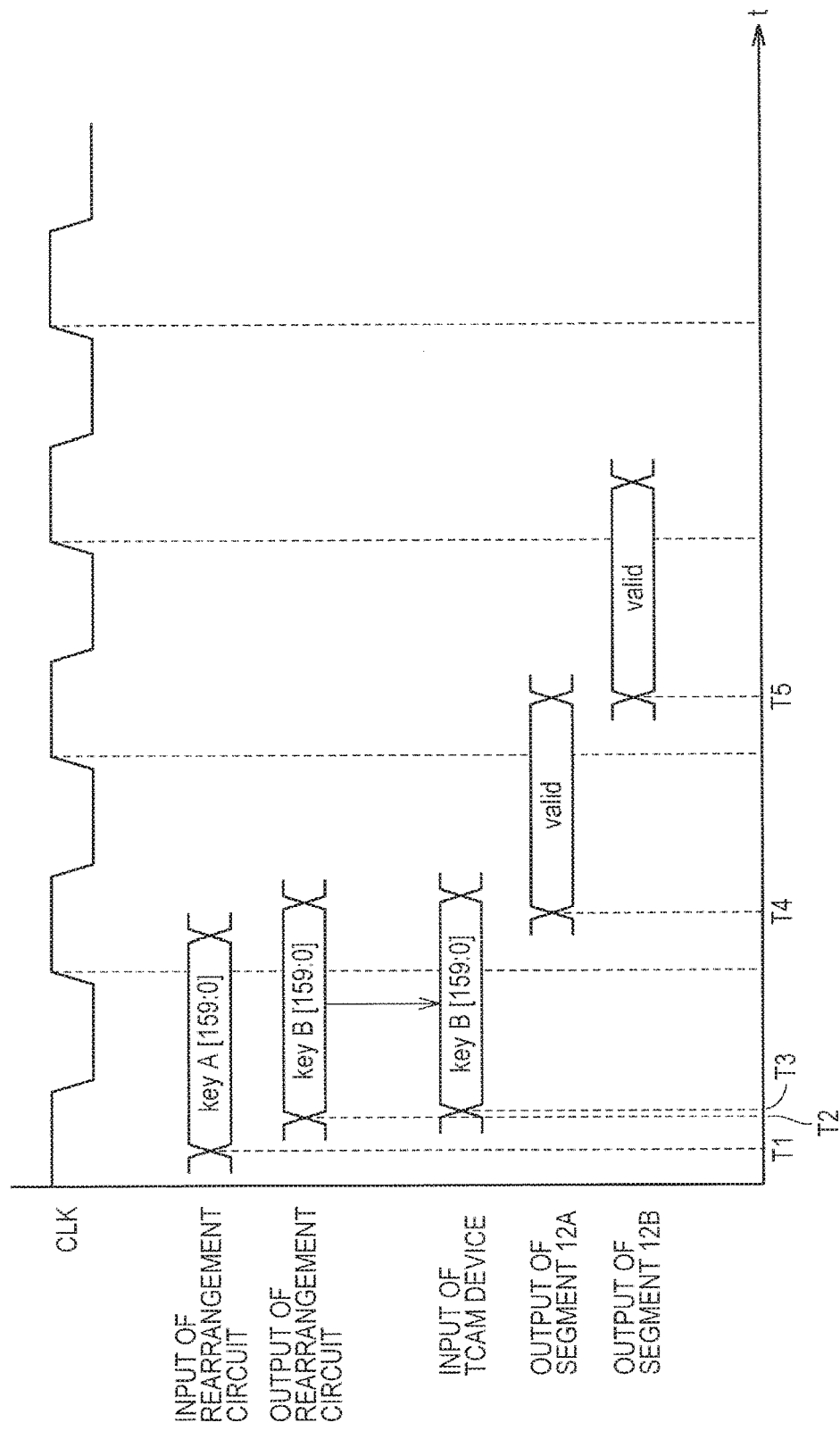
FIG. 10 is a diagram for explaining a search timing of the search block 10.

FIG. 10 is a diagram for explaining a search timing of the search block 10.

As illustrated in FIG. 10, the search block 10 operates in synchronization with a clock CLK.

The rearrangement circuit 18 acquires a search key (keyA) in a time T1, in synchronization with the clock CLK. Then, in a time T2, it outputs a search key (keyB) in accordance with the data arrangement order which has been changed based on a control signal output from the setting register 16, to the TCAM device 12. In a time T3, the TCAM device 12 receives an input of the search key (keyB) output from the rearrangement circuit 18, and then executes a search operation.

In a time T4 in a synchronization timing of the next clock CLK, in an illustrated case, a result from the segment 12A of the initial stage is output.

In a time T5 in a synchronization timing of the next clock CLK, in an illustrated case, a result from the segment 12B of the next stage is output.

By repeating the above process, the search result from the segment 12D of the final stage is output.

(About Reading of Search Memory 8)

Descriptions will be made to the reading of the entry data stored in the search memory 8 now.

When the value of the setting register 16 is "01", the rearrangement control signal generation unit 15 outputs the control signal S2 to the rearrangement circuit 18.

When the control signal S2 is input, the rearrangement circuit 18 changes the data arrangement order, and outputs it.

In this case, the rearrangement circuit 18 changes the data arrangement order of the entry data read respectively from the segments 12A to 12D.

Specifically, it changes the data arrangement order of the data read from the segment 12A and the data read from the segment 12B. The data read from the segment 12B is output as the first data, the data read from the segment 12B is output as the second data, the data read from the segments 12C and 12D are output as the third and fourth data.

Using this method, it is possible to easily restore the data to data before changing the data arrangement order, before it is stored in the search block 10.

In this embodiment, by setting the setting register 16 in a manner that the field which is assumed to be easily non-matched with the compared data is written into the initial-stage segment, it is possible to maximize the effect of this time division search.

(Maintenance of Search Memory 8)

Descriptions will be made to a maintenance operation of the search memory 8 now.

The rule table is updated in an actual operation due to various reasons. For example, it is automatically updated using the network control protocol, or its policy is changed by the network manager. Specifically, the entry is overwritten, or newly added.

Because the setting register 16 cannot be rewritten during its operation, a difference is made between the analysis content of the first rule table and the analysis content of the information of the updated rule table, due to the updating of the rule table. This may decrease the effect of the low power consumption by the time division search.

In this embodiment, descriptions will be made to a case in which the CPU 2 executes a maintenance process of the search memory 8 now. It is not limited to the CPU 2, and possible to have a configuration in which the transfer control circuit 4 (for example, NPU) may execute the process, or in which the search memory 8 has a chip for executing the maintenance process and mounted thereon.

Figure 11:
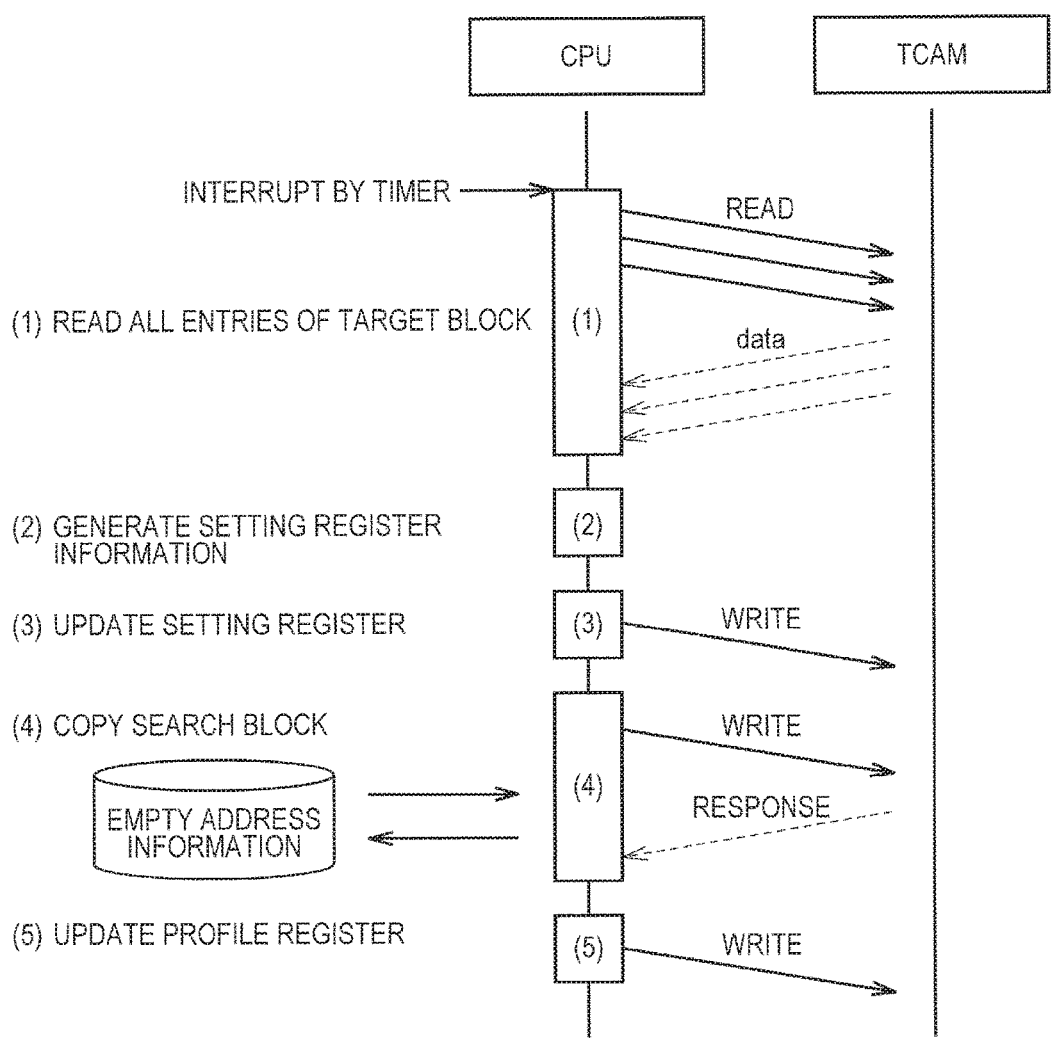
FIG. 11 is a diagram for explaining a maintenance operation of the search memory 8.

FIG. 11 is a diagram for explaining the maintenance operation of the search memory 8.

As illustrated in FIG. 11, the maintenance process is executed at the elapse of a predetermined time or the number of times of issue of a write command for the search memory 8 as a trigger. In this case, the trigger is generated as an interruption at the elapse of a predetermined time, using the timer.

The CPU 2 reads the updated rule table (read all entries) stored in the target search block 10 (for example, the search block 10-1) of the search memory 8 (1). As described, at the time of reading from the search block 10-1, the data arrangement order is changed by the rearrangement circuit 18 based on the register value of the setting register 16. As a result, it is restored to the initial data arrangement, and it can be used as is as write data for an empty search block 10, for example, the search block 10-$n$, as will be described later.

Next, the CPU 2 executes a process for analyzing the updated rule table read from the target search block 10-1, and generates information regarding the register value stored in the setting register 16 based on the analysis result (2).

The CPU 2 checks whether the register value stored in the current setting register 16, that is, the setting register 16 of the search block 10-1 is the same as the information regarding the generated register value.

That is, it judges whether the register value of the setting register 16 of the search block 10-1 specifies a field which is effective for limiting the entries. That is, it judges whether the specified field is effective for the time division search.

When it is judged that the information regarding the generated register value is different from the register value stored in the setting register 16 of the search block 10-1, the CPU 2 stores the information regarding the generated register value in an empty search block 10, that is, the setting register 16 of the search block 10_$n$ (3).

Then, it copies information regarding the updated rule table acquired from the original search block 10-1, to the TCAM device 12 of this empty search block 10_$n$ (4).

At this time, the rearrangement circuits 17 and 18 of the search block 10_$n$ change the data arrangement order, based on the stored register value of the setting register 16. Then, the data of the field which is effective for searching is stored in the segment of the initial stage of the empty search block 10-$n$.

When the copying is completed, the CPU 2 sets again the profile register 26, and replaces from the original target search block 10-1 to be searched to the copy-destination search block 10_$n$ (5).

Because a new search block 10 has the maximum effect of the low consumption power in the time division search, it contributes to the low consumption power of the entire system.

Using this maintenance method, it is possible to reduce the consumption power without stopping the operation of the entire system.

Into the search memory, various rule tables having different characteristics, such as NetFlow/FIG/QoS/ACL, are written, and the process using range development algorithm is performed, as described above. Thus, in fact, a deviation is easily generated in the data to be written into the search block. If the time division search is executed in the same manner for this data structure, the time division search is quite effective for a particular block, while the time division search is not at all effective for another block.

Particularly, a large group of "Don't care" are easily generated in the table using an IPv6 address, and this part is not suitable for limiting the target entries to be searched. Thus, when it is assigned to the segment of the initial stage for the time division search, the time division search is not effective at all.

By adopting the method based on the embodiment, it is possible to elimination the deviation of the blocks, and to maximize the effect of saving the power due to the time division search in the end.

By the method according to the first embodiment, it is possible to generate the search key suitable for the time division search for each search block using one search key. Thus, it is possible to get a plurality of search instructions together at one time and to improve the throughput.

In a device of large consumption power, such as the TCAM device, the search operation may be divided to be executed, with the limitation of the target search block to be searched, from a viewpoint of the thermal design of the system and the power supply design. In this case, reduction of the consumption power results in eliminating or reducing the division operation, thereby contributing to the improvement of the throughput of the search operation.

Second Embodiment

In a second embodiment as well, the rule set created by the end user is converted in a form of a table suitable for the search memory 8, and is divided further into smaller region to be analyzed, thereby setting the setting register 16.

In the above-described first embodiment, the descriptions have been made to the case in which the information of the field effective for the search is stored in the initial-stage segment of the TCAM device 12.

In the second embodiment, as the information of the field effective for the search, any of the regions without "Don't care" bit is stored in a BCAM (Binary Content Addressable Memory) device. The rest of the regions are stored in the TCAM device. In this embodiment, descriptions will hereinafter be made to a case in which the BCAM device is used. However, it is possible to use an ASE (Algorithmic Search Engine) for realizing searching in combination of a memory device (SRAM or FF) and a logical circuit realizing a search algorithm (tree hash).

Figure 12:
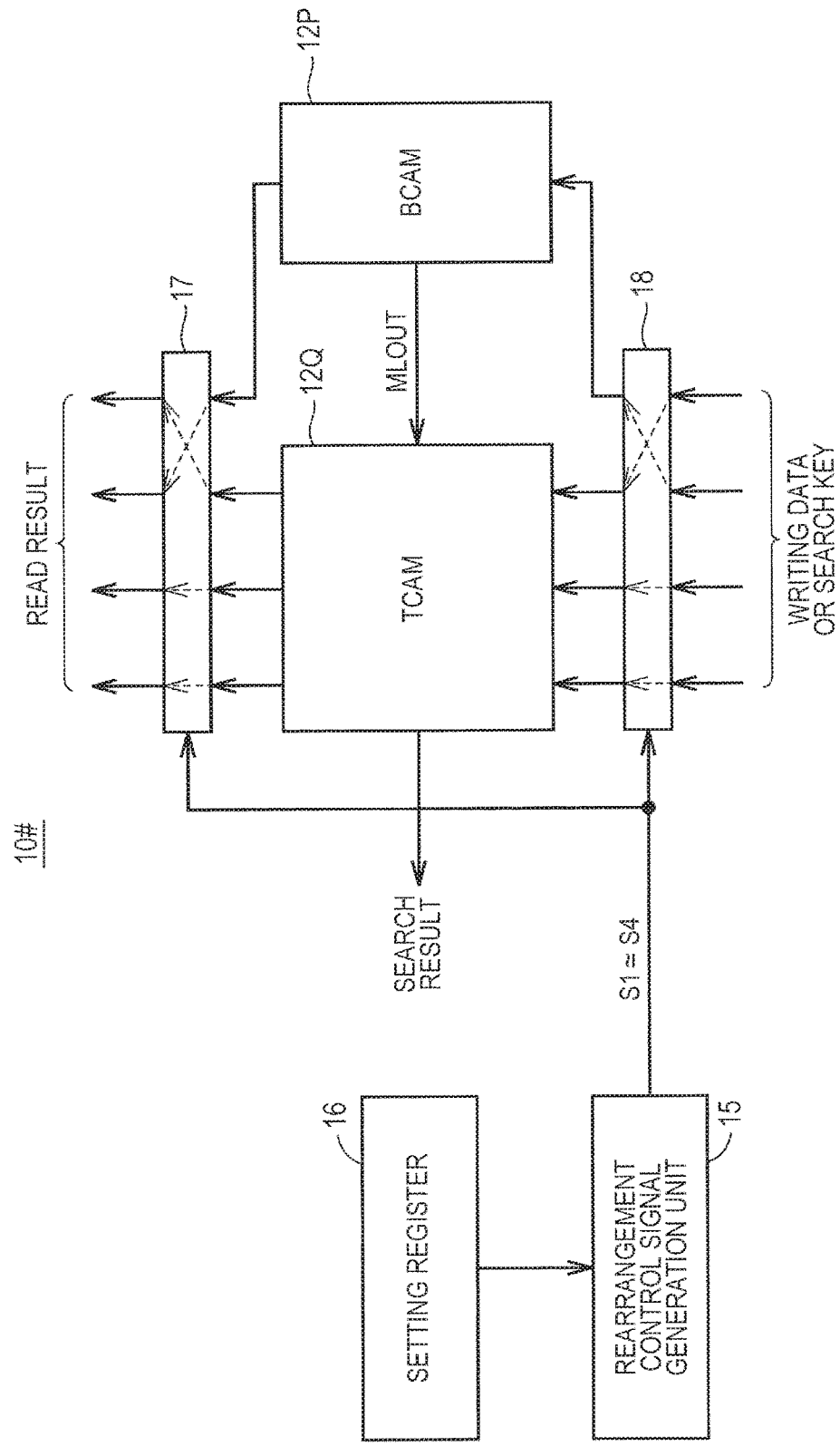
FIG. 12 is a diagram for explaining a search method of a search block 10# based on a second embodiment.

FIG. 12 is a diagram for explaining a search method of a search block 10# based on the second embodiment.

As illustrated in FIG. 12, unlike the search block 10, the search block 10# includes a BCAM device 12P and a TCAM device 12Q, instead of the TCAM device 12. Any other parts of the configurations are the same as those explained in FIG. 9, and thus will not be described over and over.

Figure 13:
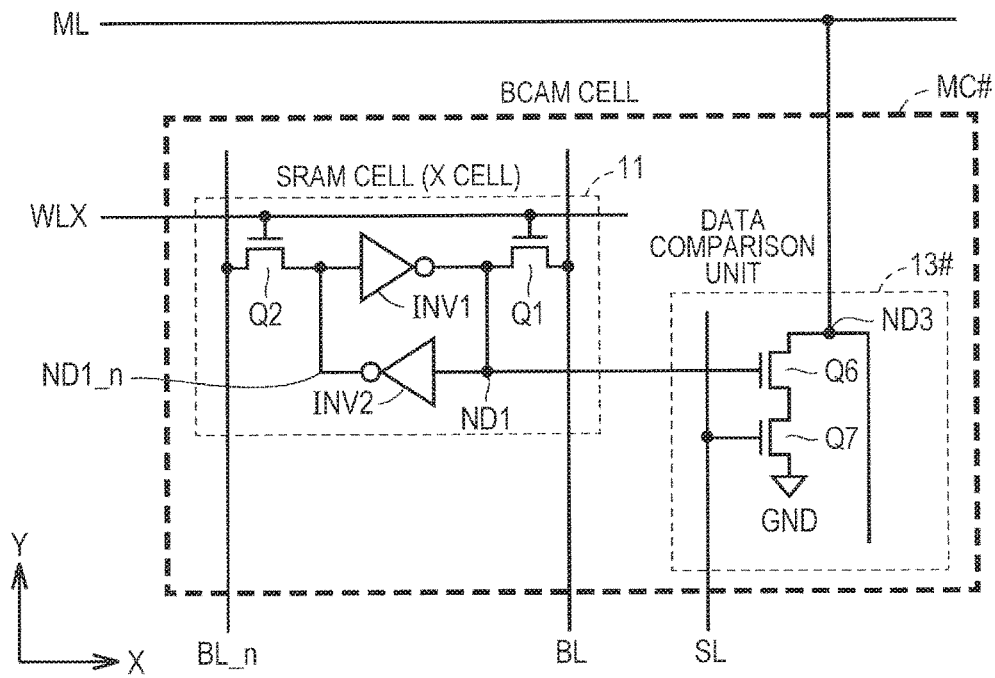
FIG. 13 is a circuit diagram illustrating an example of a configuration of a BCAM cell MC# of a BCAM device 12P.

FIG. 13 is a circuit diagram illustrating an example of a configuration of a BCAM cell MC# of a BCAM device 12P.

By reference to FIG. 13, the BCAM cell MC# includes one SRAM cell 11 and a data comparison unit 13#. The SRAM cell 11 stores complementary 1-bit data (when one is "1", the other one is "0") in the pair of internal storage nodes ND1 and ND1_n.

The BCAM cell is coupled to the pair of bit lines BL and BL_n, the pair of search lines SL and SL_n, the match line ML, and the word line WLX. The pair of bit lines BL and BL_n extend in a column direction (Y direction), and are commonly shared by a plurality of BCAM cells which are arranged in the column direction. The pair of search lines SL and SL_n extend in the column direction (Y direction), and are commonly shared by the BCAM cells arranged in the column direction.

The match line ML extends in a row direction (X direction), and is commonly shared by the BCAM cells arranged in the row direction. The word line WLX extends in the row direction (X direction), and is commonly shared by the BCAM cells arranged in the row direction.

Unlike the data comparison unit 13, the data comparison unit 13# does not include the MOS transistors Q8 and Q9. Any other parts of the configuration are the same as those of the data comparison unit 13, and thus will not be described over and over.

In the search block 10# of the second embodiment, the first search is performed by the BCAM device, and the second and following searches are performed by the TCAM device. Then, the time division operation for generating the search result is executed. Note that the BCAM device stores any field without "Don't care" in the rule set.

The value of the setting register 16 is set in a manner that the Binary segment is assigned to the initial stage segment, in the BCAM device for the time division search.

The rearrangement control signal generation unit 15 generates a control signal based on the value of the setting register 16.

The rearrangement circuits 17 and 18 change the data arrangement order of the search key, based on the control signal generated by the rearrangement control signal generation unit 15.

The value of the setting register 16 may be any value, as long as it leads to a judgment to which BCAM device or TCAM device, each of the segments is assigned. Note that, when the ASE for the tree search is used, an LPM (Longest Prefix Match) can be used as effective information, or it is possible to use anything for describing the specific search order.

In this case, from the perspective of the ASIC circuit or NPU, there is no need to pay attention to the internal structure of the search memory 8, and it is possible to automatically execute division and rearrangement of the search table by appropriately setting the register value of the setting register of each search block.

(Search of Search Memory 8)

At the time of searching, the search key generation unit 29 generates a search key.

This search key is output to each search block 10#.

The data arrangement order of the search keys distributed to the search blocks 10# is changed, by the rearrangement circuit 17 based on the value of the setting register 16.

After the rearrangement is performed by the rearrangement circuit 17, it is divided and output to the BCAM device 12P and the TCAM device 12Q.

The BCAM device 12P executes a comparison operation of the received search key and each entry data stored in the BCAM device 12P. Then, the BCAM device 12P outputs the entire comparison results as a control signal MLOUT.

The TCAM device 12Q controls the comparison operation of the received search key and each entry data, using the control signal MLOUT. Specifically, like the first embodiment, the control signal MLOUT is coupled to the "se" terminal. In this configuration, it is possible to suppress the consumption power of the TCAM device 12Q, by executing a comparison operation for the search key with only the entry data corresponding to the entry data which is hit by the BCAM device 12P.

In the TCAM device 12Q, the search result is given to the priority encoder, thereby generating a final search result address.

By this configuration, a part of the rule table is stored in the BCAM device 12P, thereby enabling to reduce the area, as compared to a case in which all rule tables are stored in the TACM device.

In the first embodiment, it is necessary to specify the field which is assumed as effective for limiting the entries in the time division search, by analyzing the rule table at the time of setting the setting register. It is necessary to analyze the number of bits of "Don't care" and the deviation of data included in a certain range. In the second embodiment, it is possible to eliminate the process of the CPU 2 in the maintenance, because the analysis can be performed based only on a binary determination or a ternary determination.

Modification

In the above-described second embodiment, the descriptions have been made to the case in which a plurality of different search modules are coupled to each other to perform the time division search.

It is necessary to delay a signal input for the second search in accordance with a delay until the first search is output.

Figure 14:
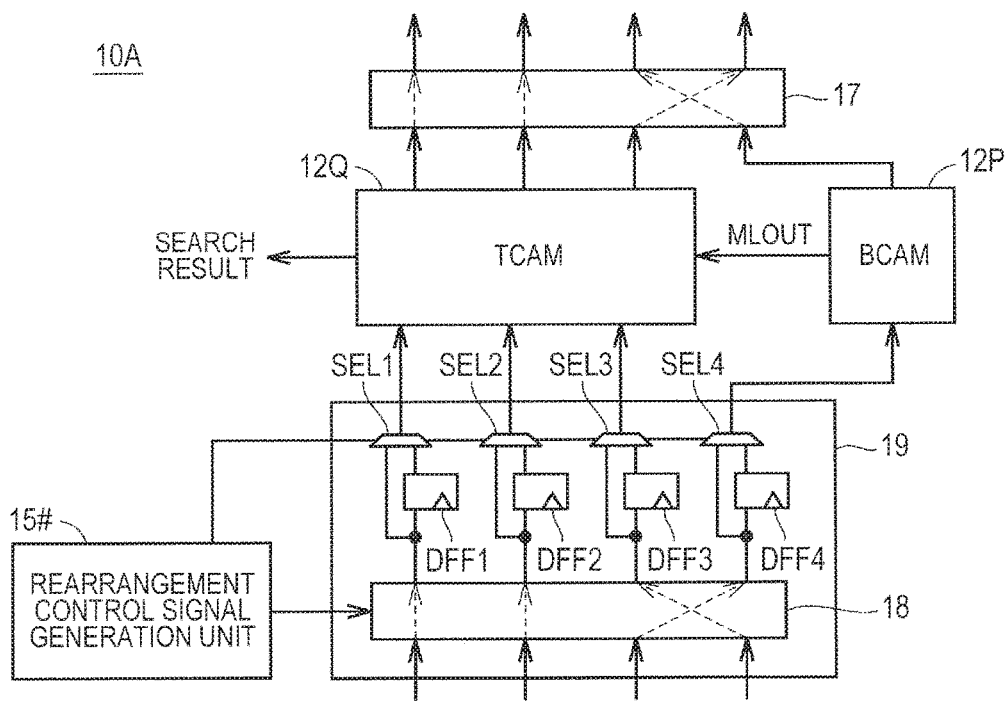
FIG. 14 is a diagram for explaining a search method of a search block 10A based on a modification of the second embodiment.

FIG. 14 is a diagram for explaining a search method of the search block 10A based on the modification of the second embodiment.

As illustrated in FIG. 14, unlike the search block 10#, the search block 10A has a timing adjustment circuit 19 provided therein.

The timing adjustment circuit 19 includes the rearrangement circuit 18, data flip flop circuits DFF1 to DFF4 for use in keeping data, and selectors SEL1 to SEL4.

The data flip flop circuits DFF1 to DFF4 keep a signal output from the rearrangement circuit 18.

The selectors SEL1 to SEL4 select and switch to output the signal output from the rearrangement circuit 18 and any of the data flip flop circuits DFF1 to DFF4.

A switching signal for switching selection of any of the selectors SEL1 to SEL4 is output from a rearrangement control signal generation unit 15#.

For example, in the case of this embodiment, the selectors SEL1 to SEL3 have a configuration for outputting a search key to the TCAM device 12Q, thus outputting data from the data flip flop circuits DFF1 to DFF3.

The selector SEL4 has a configuration for outputting a search key to the BCAM device 12P, thus outputting data as is from the rearrangement circuit 18, instead of data from the data flip flop circuit DFF4.

FIG. 15 is a diagram for explaining a search timing of the search block 10A.

As illustrated in FIG. 15, the search block 10A operates in synchronization with a clock CLK.

In synchronization with the clock CLK, the rearrangement circuit 18 acquires a search key (keyA) in a time T10. In a time T11, a search key (keyB) in accordance with the data arrangement order changed based on a control signal output from the setting register 16 is output to the BCAM device 12P. As an example, descriptions will be made to a case, in which a search key having width of 160 bits is input, a 40-bit search key is output to the BCAM device 12P, and the remaining 120-bit search key is divided to be output to the TCAM device 12Q.

In a time T12, the BCAM device 12P receives an input of a search key (keyB) output from the rearrangement circuit 18, and executes a search operation.

As illustrated, in a time T13 in the synchronization timing of the next clock CLK, a result is output from the BCAM device 12P.

In the time T13 in the same timing, a search key (keyC) kept in the data flip flop circuits DFF1 to DFF3 is output to the TCAM device 12Q.

In this embodiment, because the remaining 120-bit search key for use in the TCAM device 12Q as the post-stage segment is once taken into the data flip flop circuit DFF, it is input to the TCAM device 12Q one cycle behind. Thus, the TCAM device 12Q can receive an input of the search key and an output of the search result of the BCAM device 12P substantially at the same timing.

In a time T14, a search operation of the TCAM device 12Q is executed with the search key (keyC), based on the result from the BCAM device 12P.

As illustrated, in a time T15 in the synchronization timing of the next clock CLK, a result is output from the TCAM device 12Q.

The present disclosure has specifically been described based on the preferred embodiments. The present disclosure is not limited to the preferred embodiments, and various changes may be made without departing from the scope thereof.

What is claimed is:

1. A semiconductor device comprising:
an N number of sub-blocks each of which includes a memory cell array;
a setting register which specifies number of entry data for pre-searching, of first to N-th entry data which are divided and correspond respectively to the N number of sub-blocks; and
a search data changing unit which changes a data arrangement order for search data input based on a value of the setting register,
wherein a sub-block for pre-searching, of the N number of sub-blocks, searches for entry data which matches with data for pre-searching in accordance with the data arrangement order which has been changed by the search data changing unit, of entry data stored in each row of the memory cell array, in response to a search instruction, and outputs a search result representing matching or non-matching in association with each row, and
wherein a sub-block for post-searching, of the N number of sub-blocks, searches for entry data which matches with data for post-searching other than the data for pre-searching of search data, of entry data stored in association with each row of the memory cell array, based on a search result of the sub-block for pre-searching, and outputs a search result representing matching or non-matching in association with each row.

2. The semiconductor device according to claim 1, further comprising
a read entry data changing unit which changes an arrangement order of the first to N-th entry data read from the N number of sub-blocks based on the value of the setting register.

3. The semiconductor device according to claim 2, further comprising
an analysis unit which acquires all of the first to N-th entry data stored in association with each row of the N number of sub-blocks from the read entry data changing unit, and specifies again number of entry data for pre-searching based on a data analysis.

4. The semiconductor device according to claim 1, further comprising
a write entry data changing unit which changes a data arrangement order of first to N-th entry data for writing, based on a value of the setting register, and
wherein each of the N number of sub-blocks further includes a writing circuit which writes entry data corresponding to the changed order into the memory array.

5. The semiconductor device according to claim 1,
wherein the search data changing unit outputs data for pre-searching, of the search data to be input, to the sub-block for pre-searching, and includes a keeping circuit which keeps data for post-searching other than the data for pre-searching.

6. The semiconductor device according to claim 1,
wherein the memory cell array of the sub-block for pre-searching has memory cells which have two values for comparing the two values and the data for pre-searching and for determining matching or non-matching thereof, and
wherein the memory cell array of the sub-block for post-searching has memory cells which have three values for comparing the three values and the data for post-searching and for determining matching or non-matching thereof.

7. A semiconductor device comprising
a plurality of search blocks,
wherein each of the search blocks includes
an N number of sub-blocks each of which includes a memory cell array,
a setting register which specifies number of entry data for pre-searching, of first to N-th entry data which are divided and correspond respectively to the N number of sub-blocks, and a search data changing unit which changes a data arrangement order of search data commonly input to the search blocks, based on a value of the setting register, wherein a sub-block for pre-searching, of the N number of sub-blocks, searches for entry data which matches with data for pre-searching in accordance with the data arrangement order changed by the search data changing unit, of entry data stored in association with each row of the memory cell array, in response to a search instruction, and outputs a search result representing matching or non-matching in association with each row, and wherein a sub-block for post-searching of the N number of sub-blocks searches for entry data which matches with data for post-searching other than the data for pre-searching of the search data, of entry data stored in association with each row of the memory cell array, based on the search result of the sub-block for pre-searching, and outputs a search result representing matching or non-matching in association with each row.

8. A semiconductor device comprising:

first and second sub-blocks each of which includes associative memory cells arranged in matrix;

a setting register which specifies a correspondence relation of the first and second sub-blocks in which first and second write data included in write data are stored;

a data arrangement order changing unit which changes a data arrangement order of input search data, based on a value of the setting register, and outputs first and second search keys included in the search data respectively to the first and second sub-blocks, and wherein the first sub-block performs a search operation using one of the first and second search keys input to the first sub-block, and wherein the second sub-block performs a search operation using other one of the first and second search keys, based on a result of the search operation of the first sub-block.

9. The semiconductor device according to claim 8, further comprising a read data arrangement order changing unit which changes an arrangement order of the first and second write data which are stored respectively in the first and second sub-blocks and outputs it as read data, in accordance with a value of the setting register.

* * * * *